United States Patent [19]

Musin et al.

[11] Patent Number: 4,541,070

[45] Date of Patent: Sep. 10, 1985

[54] PULSE CHARACTERISTIC METER

[76] Inventors: Rafail M. Musin, studenchesky gorodok, GSKHI, 15, kv. 13; Mikhail I. Gryaznov, ulitsa Omskaya, 12, kv. 26; Dmitry A. Timofeev, pereulok Tkacheva, 4, kv. 3; Nikolai Y. Filatov, ulitsa Vologdina 1-a, kv. 17; Tamara S. Andreeva, ulitsa Sverdlova 93, kv. 71, all of Gorky, U.S.S.R.

[21] Appl. No.: 439,118

[22] Filed: Nov. 4, 1982

[51] Int. Cl.³ .................. G06F 03/00; G01R 19/00
[52] U.S. Cl. ............................ 364/900; 328/108; 324/77 R; 364/486
[58] Field of Search ... 364/200 MS File, 900 MS File, 364/486; 328/108; 324/77 R

[56]  References Cited

U.S. PATENT DOCUMENTS 3,568,166  3/1971  Jeudon et al. .............. 364/486
3,790,767  2/1974  Alexander .................. 364/486
4,031,367  6/1977  Murphy ..................... 364/486

FOREIGN PATENT DOCUMENTS 639134 of 0000 U.S.S.R. .
813320 of 0000 U.S.S.R. .

OTHER PUBLICATIONS

M. I. Gryaznov, Integrated Pulse Measuring Technique, Moscow, Sov. Radio Publ., 1975, USSR English Transla.
Znamensky, Tepliuk-Active RC-Filters, Sviaz, Moscow, USSR, 1970 English Transla.
A. I. Berezenko et al., Popular Library of Engineer Electronics, High-Speed Microprocessor Sets, Moscow, USSR, 1981, English Transla.
Gitis, Piskulov, Analog-Digital Converters, Moscow, USSR, English Transla, International Electrotechnical Commission Publication 469-2, 1974.
Communication Equipment, Radio-Measuring Equipment Series Issue 2 (34), on the Design of Pulse Waveform Coefficient Meter, Moscow, 1981.
Communication Equipment, Radio-Measuring Equipment Series Issue I (33), Nanosecond Pulse Analyzer Employing Microprocessors, A Discussion of Structural Features, Moscow, 1981.

Primary Examiner—Eddie P. Chan
Attorney, Agent, or Firm—Lilling & Greenspan

[57] ABSTRACT

A pulse characteristic meter comprises n integrated converters having nonlinear amplitude response and one integrated converter having linear amplitude response which provide linear and nonlinear conversion of pulses, a processing system composed of a subtraction circuit, band-pass filters, n analog memory circuits, a synchronization unit, a channel switch, an analog-digital converter, a microprocessor computer and a display unit. The input signal is nonlinearly converted and converted pulses are processed by the microprocessor computer to obtain information on basic characteristics: generalized amplitude, duration, area, energy, electric charge, shape coefficients of single and repetitive pulses whose length may be of pico-, nano- or microsecond order.

7 Claims, 6 Drawing Figures

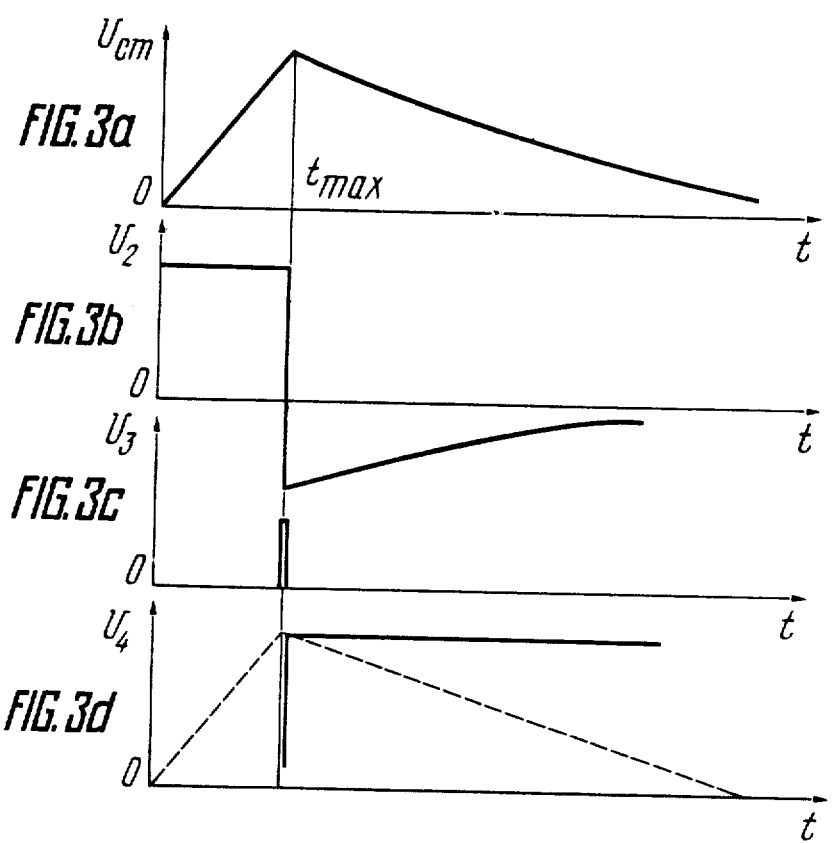

PULSE CHARACTERISTIC METER

FIELD OF THE INVENTION

The present invention relates to frequency meters, spectrum analysers featuring nonlinear distortion meters and, in particular, to pulse characteristic meters and can be used in radiomeasuring and electronic systems and devices.

PRIOR ART

Such pulse characteristic meters should measure amplitude-time and charge characteristics of small-amplitude pulses both single and repetitive, in pico-and nanosecond length range.

Such meters contain high-frequency input converters which perform nonlinear conversion and stretching (carrying the spectrum to lower frequency region) of pulses, and a system for processing these converted pulses in order to make suitable mathematical and logical operations.

At its session the International Electrotechnical Commission (IEC) recommended integrated pulse characteristics as reliable and advisable for practical applications in research of pulsed signals (Pulse Techniques and Apparatus. Part 2: Pulse Measurement and Analysis. General Considerations. Publication 469-2, Geneva, 1974).

Known in the art is a pulse characteristic meter (cf., I. I. Griaznov. Integrated Techniques of Pulse Measurement. Sov. Radio Publishers, 1975, pp. 226–232, in Russian) comprising integrated pulse converters, two of these having nonlinear amplitude response and one having linear amplitude response, whose inputs are joined to be the input of the pulse characteristic meter and whose outputs are coupled to the system for converted pulse processing built around logarithmic amplifiers.

This pulse characteristic meter uses analog system of processing of converted pulses and integrated converters having nonoptimal amplitude responses.

Stretched pulses taken from outputs of integrated converters are delivered via preamplifiers to the converted pulse processing system built around logarithmic amplifiers. In this case the output signal of one logarithmic amplifier is proportional to ln $U_{cm1}$ and the output signal of the other is ln $U_{cm2}$ (here $U_{cm1}$, $U_{cm2}$ are amplitudes of stretched pulses at outputs of nonlinear integrated converters). After computation in $U_{cm2}$ ~ in $$\frac{U_{cm2}}{U_{cm1}} \sim U_o$$

the resulting value is proportional to the generalized pulse amplitude $U_o$.

In order to measure the length of pulses logarithm is taken of the exponential output signal of the linear-amplitude-response integrated converter. The logarithm of the generalized amplitude $U_o$ is subtracted from the obtained signal. As a result, the display unit receives a value proportional to ln $t_1$, where $t_1$ is the length of the pulse.

Substantial errors cannot be avoided in the known pulse characteristic meter due to the use of logarithmic amplifiers in the analog system of processing of converted pulses. The analog system of signal processing used in the pulse characteristic meter shrinks its area of application and makes impracticable its utilization in measuring systems.

BRIEF DESCRIPTION OF THE INVENTION

The object of the invention is to provide a pulse characteristic meter capable of measuring characteristics of pulses, particularly single pulses, extremely accurately.

Another object of the invention is to provide a pulse characteristic meter having a wider field of application and capable of metering the pulse energy and electric charge.

Still another object of the invention is to provide a pulse characteristic meter capable of finding by means of a generalized amplitude $U_o$, pulse amplitudes $U_m$ by feeding pulse shape information.

One more object of the invention is to provide a pulse characteristic meter capable of operating as a part of a measuring system in nuclear physics and laser technology research.

A further object of the invention is to provide a pulse characteristic meter whose full-scale quantity production is simplified by reducing substantially the amount of adjustments to be done in the meter.

The invention essentially relates in that in a pulse characteristic meter comprising n integrated nonlinear-response converters and one linear-response integrated converter whose inputs are joined together to form the input of the pulse characteristic meter, whereas the outputs thereof are coupled to a converted pulse processing system, according to the invention, said converted pulse processing system comprises a pulse subtraction circuit having its first and second inputs connected to first outputs of two first integrated pulse converters, n analog memory circuits, the first input of the first analog memory circuit being electrically connected to the output of the pulse subtraction circuit, the first inputs of subsequent n-1 analog memory circuits being connected to respective outputs of n-2 integrated nonlinear-amplitude-response converters and to the output of the linear-amplitude-response integrated converters, a synchronizing unit whose first input is connected to the second output of the linear-amplitude-response integrated converter whose first output is connected to n second joined inputs of n analog memory circuits, the outputs of n analog memory circuits being connected to n inputs of a channel switch whose output is connected to the first input of an analog-digital converter connected to the first input of a microprocessor computer whose first and second outputs are connected, by data buses, to a display unit, whose third output is connected, by a data bus, to a common channel, the input-output of the microprocessor computer being connected by a data bus to the output-input of the analog-digital converter whose second input is connected by a data bus to the second output of the synchronizing unit, the input of the microprocessor computer being connected by a data bus to the third outputs of integrated pulse converters.

It is preferable that in the pulse characteristic meter band-pass filters are inserted into the electrical connection between the integrated converters and analog memory circuits, the first input of the first band-pass filter should be connected to the output of the subtraction circuit, the second input of the first band-pass filter should be connected to joined second outputs of the first and second nonlinear-amplitude-response integrated pulse converters, the first outputs of n-2 nonlinear-amplitude-response integrated pulse amplifiers and the first output of the linear-amplitude-response integrated pulse converter should be connected to the first inputs of the n-1 band-pass filters whose second inputs should be connected to the second outputs of n-2 non-linear-amplitude-response integrated pulse converters and to the second output of the linear-amplitude-response integrated pulse converter, the outputs of the band-pass filters being connected to the first inputs of the analog memory circuits.

It is also preferable that the pulse characteristic meter should comprise a pulse shape information input unit whose input is the pulse-shape input of the pulse characteristic meter, an input information converting unit whose input should be connected by a data bus to the output of the pulse shape information input unit, whose first output should be connected to the third input of the microprocessor computer, the second input of the input information converting unit being connected to n+2 input of the channel switch.

It is no less preferable that the pulse characteristic meter should be equipped with an external synchronization input of the synchronizing unit.

This invention permits non-oscilloscopic high-accuracy metering of characteristics of pulses in pico- and nanosecond length range.

The use of the microprocessor computer in the proposed pulse characteristic meter permits appreciably field of application of the meter by utilizing one meter design to produce various other modifications for other applications in order to be able to cope with a wide range of uses in nuclear physics and laser technology research.

BRIEF DESCRIPTION OF THE DRAWINGS

The invention will now be described in more detail, by way of example, with reference to the accompanying drawings, wherein:

FIGS. 3a,b,c, shows time charts explanatory of variations of pulse amplitudes, according to the invention.

DETAILED DESCRIPTION OF THE INVENTION

Figure 1:
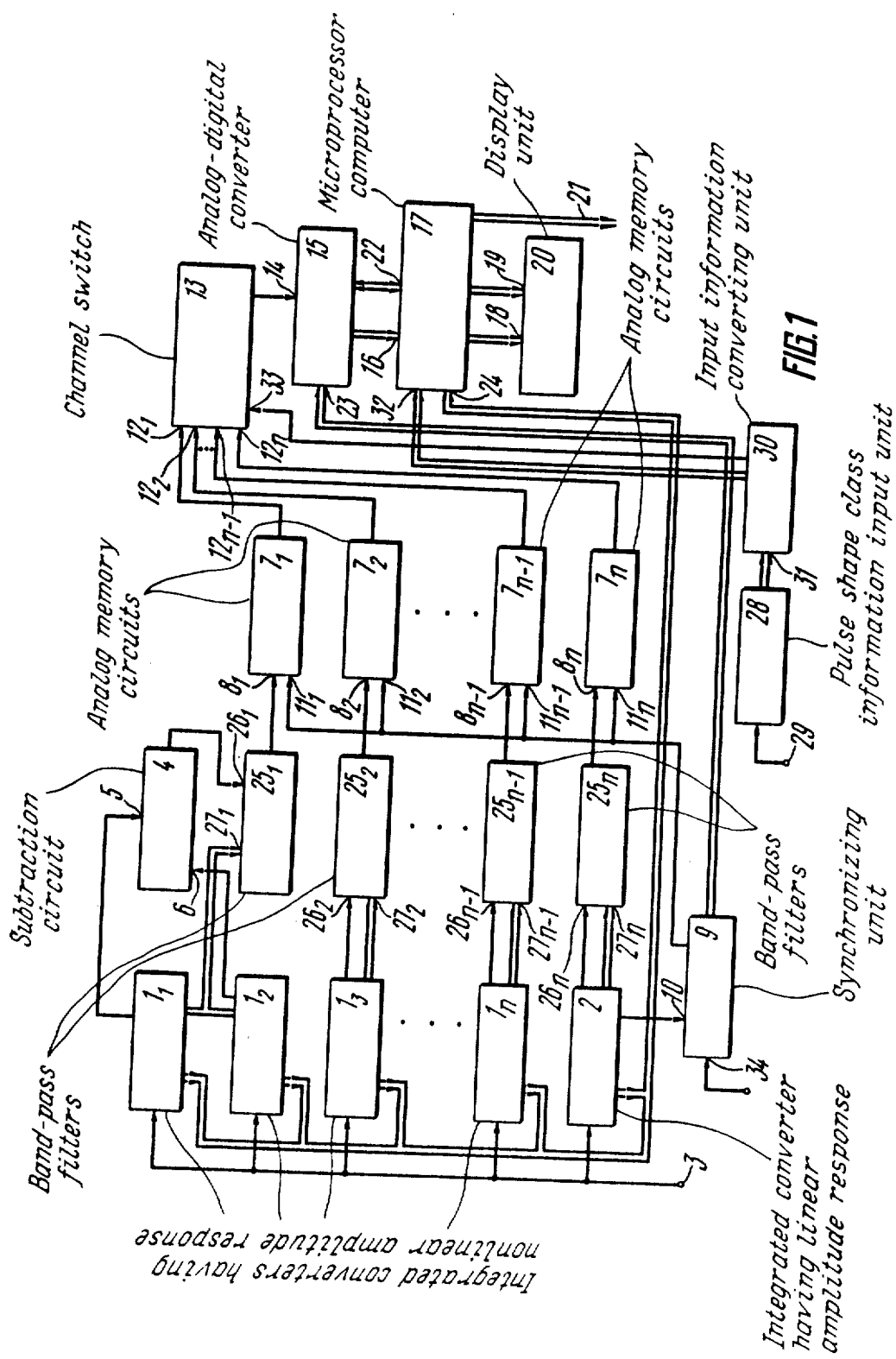
FIG. 1 is a block diagram of a pulse characteristic meter, according to the invention.

The proposed device has been realized as a computer-based pulse characteristic meter wherein two integrated converters having nonlinear amplitude response and one integrated converter having linear amplitude response (cf., R. M. Musin, M. I. Griaznov, D. A. Dmitriev. Nanosecond Pulse Characteristic Meter Built around Microprocessors. Communications Equipment, Radio Measuring Equipment, 1(33) Issue, Moscow, 1981, pp. 38-45, in Russian).

The design of the pulse characteristic meter (FIG. 1) allows for a wider field of applications and technical capabilities of the meter when used in research in nuclear physics (controlled thermonuclear reactions) and laser technology (optical signal research).

A pulse characteristic meter comprises integrated converters $1_1$ (FIG. 1), $1_2$, $1_3$, ... $1_n$ having nonlinear amplitude characteristics and an integrated converter 2 having linear amplitude characteristics. Inputs of both converters are joined to be the input 3 of the pulse characteristic meter, the outputs thereof being coupled with a converted pulse processing system.

The converted pulse processing system comprises a subtraction circuit 4 whose inputs are connected to first outputs of two integrated pulse converters $1_1$ and $1_2$, n analog memory circuits $7_1 \ldots 7_{n-1}, 7_n$. An input $8_1$ of the analog memory circuit $7_1$ is electrically connected to an output of the subtraction circuit 4 and inputs $8_2 \ldots 8_n$ of the analog memory circuits $7_2 \ldots 7_n$ are connected to respective outputs n-2 of the integrated pulse converters $1_3 \ldots 1_n$ are to the output of the integrated pulse converter 2.

The pulse characteristic meter also comprises a synchronizing unit 9 whose input 10 is connected to the second output of the integrated converter 2 the first output thereof being connected to joined inputs $11_1 \ldots 11_n$ of the analog memory circuits $7_1 \ldots 7_n$ whose outputs are coupled to inputs $12_1 \ldots 12_n$ of a channel switch 13. The output of the channel switch 13 is connected to an input 14 of an analog-digital converter 15 whose output is coupled by a data bus to an input 16 of a microprocessor computer 17 having its first and second outputs connected by data buses to inputs 18 and 19 of a display unit 20, having its third output connected by a data bus 21 to a common channel.

An input-output 22 of the microprocessor computer 17 are connected by a data bus to the output-input of the analog-digital converter 15 whose input 23 is connected by a data bus to the output of the synchronizing unit 9. An input 24 of the microprocessor computer 17 is connected by a data bus to third outputs of the integrated converters $1_1, \ldots 1_n$ and 2.

Band-pass filters $25_1 \ldots 25_n$ are incorporated in order to make measurements of pulse characteristics more accurate. All band-pass filters are similar in design. An input $26_1$ of the band-pass filter $25_1$ is connected to the output of the subtraction circuit 4, inputs $26_2 \ldots 26_{n-1}$ of the band-pass filters $25_2 \ldots 25_{n-1}$ are connected to outputs of the integrated converters $1_3 \ldots 1_n$, whereas an input $26_n$ of the band-pass filter $25_n$ is connected to the output of the integrated converter 2. An input $27_1$ of the band-pass filter $25_1$ is connected to the joint output of the integrated converters $1_1$ and $1_2$. Inputs $27_2 \ldots 27_{n-1}$ of the band-pass filters $25_2 \ldots 25_{n-1}$ are connected to outputs of the integrated converters $1_3 \ldots 1_n$, whereas an input $27_n$ of the band-pass filter $25_n$ is connected to the output of the integrated converter 2. Outputs of the band-pass filters $25_1 \ldots 25_n$ are connected to the inputs $8_1 \ldots 8_n$ of the analog memory circuits $7_1 \ldots 7_n$.

In order to measure maximum pulse amplitudes, with information on pulse shapes available, the pulse characteristic meter comprises a pulse shape information input unit 28 whose input is the input 29 of the pulse characteristic meter, an input information converting unit 30 whose input 31 is connected by a data bus to the output of the pulse shape information input unit 28. The first output of the unit 30 is connected by a data bus to an input 32 of the microprocessor computer 17 and the second input of the unit 30 is connected to an input 33 of the channel switch 13.

The synchronizing unit 9 features an external synchronization input 34.

The integrated converters $1_1, 1_2, \ldots 1_n$ are built around nonlinear elements whose nonlinearity is not uniform in order to be able to measure pico- and nanosecond low-amplitude (from 2 mV to 100 mV) pulses.

The input 3 of the pulse characteristic meter is connected, via an RC circuit comprising a capacitor 35 and a resistor 36, to the base of a transistor 37, for example, of the integrated converter $1_1$. The load of the converter $1_1$ is a resistor 38 and a capacitor 39. The collector of the transistor 37 is connected via the resistor 38 to a supply source 40 and the emitter thereof is connected to a case 41. A universal switch 42 is connected to the collector of the transistor 37. Resistors $44_1, 44_2, \ldots 44_m$ are connected by means of a switch 43 to the case 41, whereas second leads of the resistors $44_1, 44_2, \ldots 44_m$ are jointed and coupled with a supply source 45. First leads of the resistors $44_1, 44_2, \ldots 44_m$ of the integrated converters $1_1, 1_2, \ldots 1_n$ are connected by a data bus to the inputs $27_1, 27_2, \ldots 27_n$ of the band-pass filters $25_1, 25_2, \ldots 25_n$. The switch 42 is made similar to the switch 42, and m outputs of the switch 42 of all integrated converters $1_1, 1_2, \ldots 1_n$ having nonlinear amplitude response, as well as m outputs of the switch 42 of the integrated converter 2 having linear amplitude response are joined together and coupled to the input 24 of the microprocessor 17.

The input 3 of the pulse characteristic meter is also connected, via the capacitor 35 and resistor 36 whose second output is connected to the case 41, to the base of the transistors 37 whose emitter is connected, via the resistor 46, to the case 41 and whose collector is connected to the switch 43 of the integrated converter 2 and, via the resistor 38, to the supply source 40, and, via the capacitor 39, to the case 41.

The output of the subtraction circuit 4 is connected to the high-resistance input of an isolation circuit 47 whose output is connected, via filter elements-capacitors 48, 49 and resistors $50_1, \ldots 50_m$, 51, 52, 53, to the input of an amplifying stage 54. Here capacitor 48 is connected to the capacitor 49 and resistors 51, $50_1, \ldots 50_m$, the second lead of the resistor 51 being connected to the case 41, whereas the capacitor 49 is coupled to the resistor 53 whose second lead is connected to the output of the amplifying stage 54. The output of the amplifying stage 54 is connected, via an isolation circuit 55, to the second section of the band-pass filter, which is identical to the first section thereof. The output of the amplifying stage 54 of the second section of the band-pass filter $25_1$ is connected, via a resistor 56, to a group of dividers comprising field transistors $57_1, \ldots 57_m$ and resistors $58_1, \ldots 58_m$. Leads of the resistors $58_1, \ldots 58_m$ are joined and coupled to the supply source +E. Sources of field transistors $57_1, \ldots 57_m$ are connected to the case 41, whereas drains are joined and connected to the lead of a resistor 56 and to the input $8_1$ of the analog memory circuit $7_1$. Second leads of the resistors $50_1, \ldots 50_m$, gates $59_1, \ldots 59_m$ of the field transistors $57_1, \ldots 57_m$ are connected to the data bus coupled to the joined outputs of the integrated converters $1_1$ and $1_2$.

The output of the linear-amplitude-response integrated converter 2 is connected to an input 60 of a preamplifier 61 whose second input 62 is connected to the case of the synchronizing unit 9. The output of the preamplifier 61 is connected, via a capacitor 63 and a resistor 64 whose second lead is coupled to the case 41, to the first input of a final amplifier 65 whose second input is connected to the case and the output is connected to a first input 66 of a synchronizing signal shaping device 67 whose second input is connected to the input 34 of the pulse characteristic meter and whose first output 68 is connected to the inputs $11_1, \ldots 11_n$ of the analog memory circuits $7_1, \ldots 7_n$, whereas the second output 69 is connected by a data bus to the input 23 of the analog-digital converter 15.

The pulse characteristic meter of FIG. 1 operates as follows.

Pulses from the input 3 of the meter are supplied to n integrated pulse converters $1_1, 1_2, 1_3, \ldots 1_n$ having nonlinear amplitude response and to the integrated pulse converter 2 having linear amplitude response.

The integrated pulse converters $1_1, 1_2, 1_3, \ldots 1_n$ and 2 perform nonlinear and linear conversion of input pulses and linear widening (integration) thereof. After the latter operation the high frequency spectrum of the input pulse signal is brought to a lower frequency level. This substantially simplifies the task of designers of a system for processing converted pulses.

In consequence the output of the integrated converter $1_1$ is the pulse amplitude $P_{11}$ equal to:

$$P_{1l} = A_l t_1 \int_o^{t_2} F_l[U_1(t)]dt \quad (1)$$

where:

$A_1 =$ is some constant coefficient dictated by the circuit and operational conditions of the integrated converter;

$t_1 =$ length of the input pulse, $U_1(t) = U_m \cdot \epsilon(t)$ $\epsilon(t)$-is a function describing the pulse shape;
$F_1$-is a function describing the characteristic of the nonlinear element of the $1_{lth}$ integrated converter;
$t_2$-is the integration time;
$U_m$-is the amplitude of input pulses.

The amplitude for the integrated converter 2 is:

$$P_2 = A_2 t_1 U_m \int_o^{t_2} \epsilon(t) \, dt \quad (2)$$

The equations (1) and (2) describing signals at n+1 outputs of integrated converters form, therefore, a system having n+1 equations containing information about the amplitude, length and shape of said input pulses.

In this case, if amplitude characteristics of integrated converters are described by functions of the first order, second order, third order, fourth order, etcetera, the accuracy of measurement of pulse characteristics is increased too.

In this embodiment the integrated converter 2 has a linear amplitude response. The integrated converters $1_1$ and $1_2$ have amplitude responses described by exponential functions. The output signal of the subtraction circuit 4 varies directly as the square of the amplitude $U_m$ of the input pulse. In a way the integrated converters $1_1$, $1_2$ together with the subtraction circuit 4 form a synthesized integrated converter having a quadratic amplitude response.

Integrated converters $1_3, 1_4 \ldots 1_n$ can be built around synthesized nonlinear elements and have amplitude responses described by third or fourth order functions. The above pulses (FIG. 3a) fed from the output of the subtraction circuit 4 (FIG. 1) and from the outputs of the integrated converters $1_3, 1_4, \ldots 1_n$ are delivered to the band-pass filters $25_1, 25_2, \ldots 25_n$.

The band-pass filters $25_1, 25_2, \ldots 25_n$ are mainly meant to eliminate low-frequency pickup in the widened pulse path. This seems indispensable because integrated converters, like classical integrators, have an amplitude response curve with a rise in the low-frequency area, that is are attenuators of the operating signal and amplifiers of low-frequency noise.

To comply with the length of pulses at the input 3, the band-pass filters $25_1, 25_2, \ldots 25_n$ are adjusted by changing the parameters of RC circuits of these filters. As pulses become longer, the transmission band of the filters $25_1, 25_2, \ldots 25_n$ widens, and as pulses become shorter, the transmission factor of the band-pass filters $25_1, \ldots 25_n$ increases. This facilitates elimination of low-frequency pickup contributing to more accurate measurements, and, in addition, compensation of signal attenuation in pico- and nanosecond pulse length ranges, which, in the long run, also contributes to more accurate pulse characteristic metering.

The signal is attenuated due to limitations of the speed of response of circuit components located after the integrated converters $1_1, \ldots 1_n$ (cf., for example, A. E. Znamensky, I. N. Tepliuk. Active RC Filters. Svyaz Publ., Moscow, 1970, pp. 88–98, in Russian).

The use of band-pass filters $25_1, \ldots 25_n$ along with the microprocessor computer 17 allow for more accurate metering of characteristics of pulses, particularly single ones.

Stretched pulses from outputs of the band-pass filters $25_1, 25_2, \ldots 25_n$ are supplied to analog memory circuits $7_1, 7_2, \ldots 7_n$. These circuits gate the stretched pulse as it reaches the maximum amplitude $U_{cm}$ (FIG. 3a), the time being $t_{max}$, and store the value $U_4$ (FIG. 3d) for some time. Gating is done by control pulses $U_3$ (FIG. 3c) generated in the synchronizing unit 9 (FIG. 1). The maximum amplitude of the stretched pulse is rigidly gated by the time curve of the control pulse of the synchronizing unit 9 by fitting said unit 9 with a differentiating circuit (cf., for example, R. M. Musin, M. I. Griaznov, V. E. Yurtaev, T. S. Andreeva. USSR Inventor's Certificate No. 639,134, Aug. 28, 1978). In addition the unit 9 generates auxiliary signals to control the analog-digital converter 15.

Fixed voltages $U_4$ (FIG. 3d) are supplied from the outputs of the analog memory circuits $7_1$ (FIG. 1) to n inputs $12_1, \ldots 12_n$ of the channel switch 13 which is an array of quick-acting electronic switches operating either at suitable periods or according to a specific algorithm on the basis of a control signal available from the analog-digital converter 15 or input information conversion unit 30 (cf., M. I. Griaznov. Integrated Pulse Measuring Technique. Sov. Radio Publ., 1975, pp. 170–173).

The analog-digital converter 15 (for digit-wise coding) converts analog data into a binary code (cf., E. I. Gitis, E. A. Piskunov. Analog-Digital Converters. Energoizdat Publ., 1981, pp. 233–241, in Russian) and in order to secure suitable accuracy requires stability of amplitude of the signal $U_4$ (FIG. 3d).

The analog-digital converter 15 (FIG. 1) begins operating when a starting pulse generated in the synchronizing unit 9 arrives through a data bus to the input 23. In addition auxiliary pulse signals are supplied through said data bus from the synchronizing unit 9 for repeated operation of the analog-digital converter 15 (when signals in the data processing channel alters). The analog-digital converter 15 in its turn generates and feeds to the microprocessor computer 17 the following signals:
 codes of the main signal (10 digits);
 termination pulse for the analog-digital converter 15;
 complete cycle pulse for the converter 15;
 display signals of measurant dimensions.

The microprocessor computer in its turn sends signals to the analog-digital converter to indicate that the computer is ready to receive new information.

In this manner the analog-digital converter 15 receives information on characteristics of pulses from the outputs of the circuits $7_1, 7_2, \ldots 7_n$ via the channel switch 13. The pulses are the following:

$$(U_4)_{11} \sim t_1 U_m^2 s_2$$

$$(U_4)_{12} \sim t_1 U_m^3 s_3$$

$$(U_4)_{1n} \sim t_1 U_m^n s_n$$

$$U_2 \sim t_1 U_m s_1 \tag{3}$$

where $$s_n = \int_o^{t_2} \epsilon^n(t)\, dt;$$

$\epsilon(t)$ is the function describing pulse shape. Constant voltages $U_4$ at the outputs of the analog-digital converters 15 (FIG. 1) contain information on amplitude; length and shape of pulses. This information is quite sufficient for univocal determination of pulse characteristics, which is done by feeding coded signals $(U_4)_{11}, (U_4)_{12}, \ldots (U_4)_{1n}$ and $(U_4)_2$ via a data bus to the microprocessor computer 17 (FIG. 1) wherein logical operations to convert the binary code into BCD code are supplemented by arithmetical operations. The following ratios are found here:

$$h_1 \sim \frac{(U_4)_{11}}{(U_4)_2} \sim U_m \frac{S_2}{S_1} = U_m K_1 = U_o \tag{4}$$

This is a generalized amplitude of pulses.

$K_1$-is a first-type shape coefficient of the first order (M. I. Griaznov. Integrated Pulse Measuring Technique, Moscow, Sov. Radio Publ., 1975, pp. 42–60).

$$h_2 \sim \frac{(U_4)_{11}}{U_o} = t \frac{S_1}{IK_1} = t_1 \frac{S_1^2}{S_2} = t_{1\alpha} \tag{5}$$

here $t_{1\alpha}$ is a generalized pulse length measured at the level found from the ratio $S_1^2 = S_2$.

$$h_3 \frac{(U_4)_{11}(U_4)_2}{(U_4)_{12}} = \frac{S_2 S_1}{S_3} = \phi_1 \tag{6}$$

$\Phi_1$ is an integral second-type shape coefficient of the first order (R. M. Musin. Pulse Shape Coefficient Meter.

USSR Inventor's Certificate No. 813,320 Nov. 14, 1980).

In this manner various combinations of quanitites $U_{11}, U_{12}, \ldots U_{1n}, U_2, U_0$ permit determination of shape coefficients of pulses $\Phi_n$ of higher orders. With these coefficients available the pulse can be described in a more detailed way even to particulars of its shape (length of leading and trailing edges, top chippings, undershoots and oscillations on the pulse edge).

The microprocessor computer 17 comprises:

a control unit (not shown) which secured fulfilment of the assigned algorithm of the meter (R. M. Musin, M. I. Griaznov, D. A. Timofeev. Designing of Nanosecond Pulse Characteristic Meter Using Microprocessors. Communications Technology, Radio Measuring Equipment series, 1(33) Issue, Moscow, 1981, pp. 38-45, In Russian); a microprocessor performing assigned logical and mathematical operations with signals according to microinstructions fed from the control unit (cf., A. I. Berezenko, L. N. Koriagin, A. R. Nazarian. Fast-Action Microprocessor Units. Moscow, Radio i Sviaz, 1981, pp. 28-35, 60-62, 15-25).

The use of n integrated converters $1_1, \ldots 1_n$, 2 and the microprocessor computer 17 makes functional capabilities of the meter much wider, it becomes possible to measure the energy, area and charge of the pulse.

Signals (logical "1" and "0") from the outputs of the integrated converters $1_1, 1_2 \ldots 1_n$ and 2 are supplied via a data bus to the microprocessor 17 to ensure display of measurement dimensions.

The microprocessor 17 starts operating when the termination pulse arrives from the analog-digital converter 15. In its turn the microprocessor 17 generates a termination signal to permit reception and processing of data by the analog-digital converter 15.

The measurements are transmitted via the data bus 21 to the common channel. In addition, the results of measurements are supplied via data buses and inputs 18 and 19 of the display unit 20 to two displays (not shown).

Availability of measurement results in the common channel makes it possible to use the pulse characteristic meter as a component of measuring systems in nuclear and laser research.

When nonperiodic pulses are studied or when characteristics of one pulse out of a train are to be measured, the pulse characteristic meter uses external synchronization. To this end, pulses fed to the input 34 of the meter are matched in time with the pulse to be studied. In all other respects the operation of the pulse characteristic meter is no different from the procedure described above.

The pulse characteristic meter determines the amplitude (maximum value) of a pulse using the measured generalized pulse amplitude. To this end, the shape class information is fed to the input 29 of the pulse shape information input unit 28 from either the computer or some other unit. The most convenient type of information in this case are shape coefficients $K_1$.

The pulse shape class information input unit 28 is in the simpliest case a code switch or a digital-analog converter intended to feed pulse shape information as a first-type shape coefficient $K_1$ to the microprocessor computer 17. The microprocessor 17 produces pulse amplitudes of arbitrary shapes in accordance with the generalized amplitude with the aid of the formula $$U_m = \frac{U_o}{K_1} \quad (7)$$

The information on the shape coefficient $K_1$ or $\Phi_1$ (R. M. Musin, M. I. Griaznov, N. Yu. Filatov. Pertaining to the Problem of Designing Videopulse Shape Coefficient Meter. Communications Technology, Radio Measuring Equipment series, Moscow, 2(34) issue, 1981, pp. 15-20, in Russian) can be fed to the input 29 of the characteristic meter ether manually (by means of controls on the front panel of the meter) or by a program (via the common channel) from a computer or a shape coefficient meter (not shown).

The information is further supplied as a digital code or constant voltage from the output of the pulse shape class information input unit 28 to the input 31 of the input information converting unit 30.

The unit 30 is to convert the information fed from the unit 28 into the binary code and pass it over to the input 32 of the microprocessor 17 via a data bus.

In this manner the amplitude $U_m$ is found with the aid of the generalized amplitude $U_o$.

In nuclear and laser applications the pulse characteristic meter is very often used to measure characteristics of one pulse out of a nonperiodic sequence or parameters of random pulses.

To this end use is made of the input 34 of the pulse characteristic meter. An external synchropulse is applied to this input 34 and matched in time with the pulse whose characteristics are to be measured, and characteristics of this pulse are measured.

Unlike the known device the proposed pulse characteristic meter has its analog section substantially reduced by using a microprocessor. Moreover, quantity production of such meters requires less labour input for assembly and adjustment operations.

Figure 2:
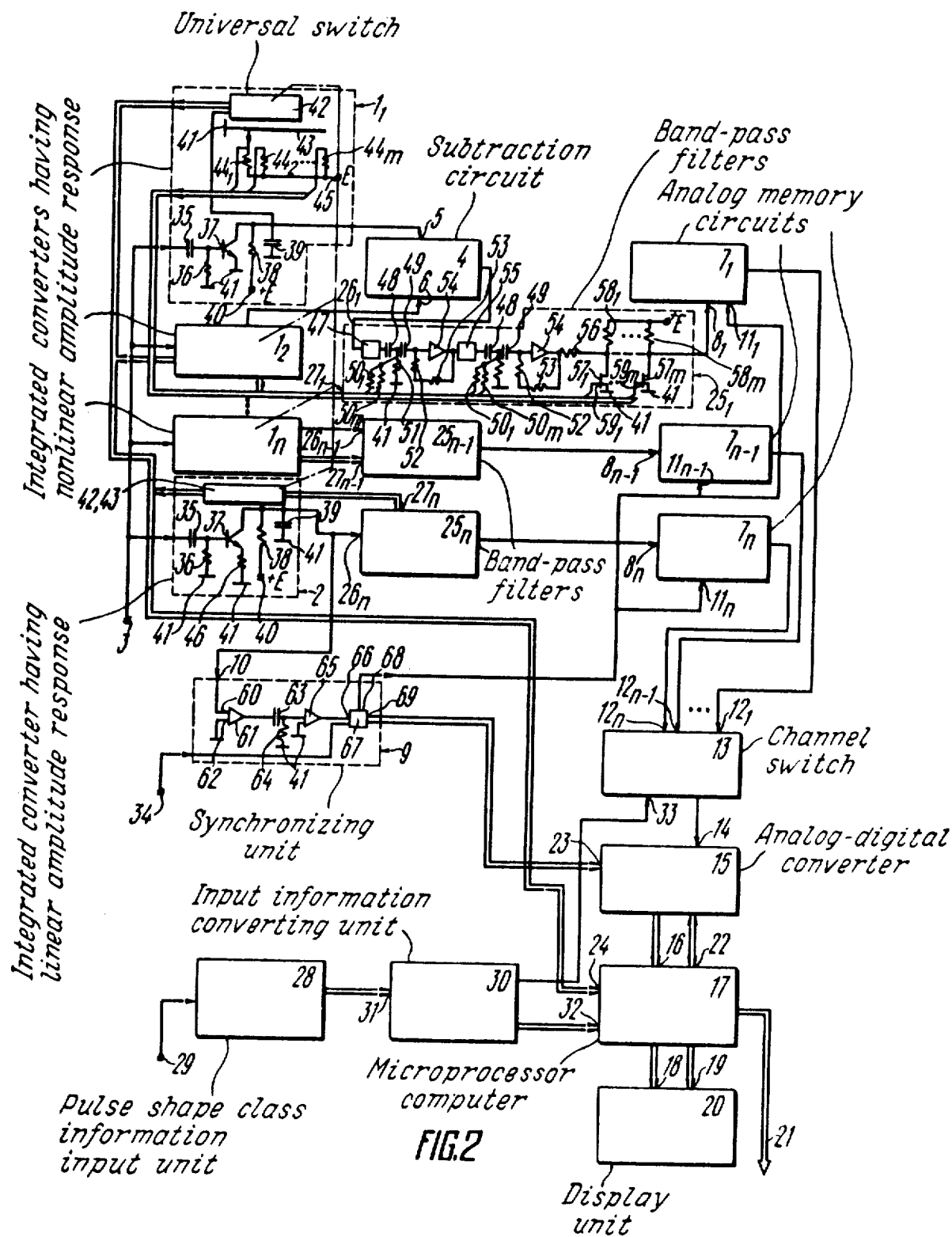
FIG. 2 is a skeleton diagram of a pulse characteristic meter, according to the invention.

The pulse characteristic meter of FIG. 2 operates as follows.

Integrated converters $1_1$ and $1_2$ can be built around nonlinear elements (diodes, transistors) having current-voltage characteristics $F_1 \sim (e^{\lambda_1 U_1} - 1)$ and $F_2 \sim (1 - e^{-\lambda_2 U_1})$ where $\lambda_1, \lambda_2$ are curvatures of the current-voltage characteristic of a nonlinear element, and $U_1$ is the amplitude of input pulses.

Let us represent functions $F_1$ and $F_2$ as Maclaurin's series and find the difference between said two functions (which is done in the subtraction circuit 4). The amplitude of the output signal of the subtraction circuit 4 is proportional to the square of the amplitude of pulses at the input 3 of the meter, that is $$F_1 - F_2 \approx A U_m^2 \quad (8)$$

where A is a constant coefficient (cf., R. M. Musin, M. I. Griaznov, N. Yu. Filatov. Pertaining to the Problem of Designing Videopulse Shape Coefficient Meter. Communications Technology, Radio Measuring Equipment series, Moscow, 2(34) issue, 1981, pp. 15-20, in Russian).

Integrated pulse converters $1_3, 1_4, \ldots 1_n$ are built around nonlinear elements whose current-voltage characteristic is described by functions of the third, fourth, etcetera powers. To this end so called synthesized nonlinear elements having optimal characteristics can be employed (cf., M. I. Griaznov. Integrated Pulse Measuring Technique, Moscow, Sov. Radio Publ., 1975, pp. 103-114, in Russina).

Characteristics of pulsed signals can be measured due to insertion of RC circuits (35,36) at the input of the integrated converter $1_1$.

The load, resistor 38 and capacitor 39, is selected to secure linear relation between the amplitude of converted pulses and the length of input pulses, that is $$\tau = RC >> t_1 \quad (9)$$

The integrated converter 2 is also equipped with a resistor 46 inserted into the negative current feedback. The amplitude of the output signal of said converter 2 is, therefore, the linear function of both the length and the amplitude of input pulses.

In order to provide a specified input pulse length range, it should be divided into length bands each having a switch: the switch 42 (converters $1_1, 1_2 \ldots 1_n$) and switch 43 (converter 2). In each length band the rating of the load capacitor 39 of the transistor 37 changes as much as the maximum length of this band differs from the maximum length of the preceding band.

Commutation of length bands is accompanied by commutation of signals (in 1-2-4-8 code) corresponding to specified dimensions by means of the switches 42 of the integrated converters $1_1, 1_2, \ldots 1_n$ and the switch 43 of the integrated converter 2. Signals corresponding to pulse dimensions are supplied as a code via a data bus to the input 24 of the microprocessor computer 17. This information is used to determine dimensions (ps, ns, $\mu$s) of the induced pulse duration.

Another data bus is employed to transmit signals (as 1-2-4-8 code) from the switches 43 of the integrated converters $1_1, 1_2 \ldots 1_n$ and 2 to control dividers—field transistors $57_1, \ldots 57_m$ and resistors $58_1, \ldots 58_m$.

Initially the field transistors $57_1, \ldots 57_m$ are closed.

Signals arriving in specific sequences (depending on the pulse duration band) change the rating of the divider and, consequently, the magnitude of pulses at inputs $8_1, 8_2 \ldots 8_n$ of the analog memory circuits $7_1, 7_2 \ldots 7_n$. In this way pulse amplitudes at the inputs $8_1, 8_2, \ldots 8_n$ of the circuits $7_1, 7_2, \ldots 7_n$ can be made equal in all pulse duration bands.

Switches 42 perform mechanical commutation of second leads of the resistors $50_1 \ldots 50_m$ and band-pass filters $25_1 \ldots 25_n$.

The bandwidth of band-pass filters $25_1, \ldots 25_n$ varies with the pulse length band, that is with the time constant of decay of output pulses of the subtraction circuit 4 and integrated converters $1_3, 1_4, \ldots 1_n$ and 2. In this manner low-frequency pickup (noise) is filtered more thoroughly. In practical terms, the "shortest" pulse durations have the least decay time constant $\tau$ of the exponentially shaped widened pulse because the condition $\tau \simeq (30 \div 40) t_1$max is true for all duration bands.

Undistorted transmission of "short" (pico- and nanosecond) pulses, where the low-frequency noise is more pronounced, can, therefore, be achieved by substantially narrowing the bandwidth of filters, which can be further on increased as the duration of input pulses grows.

It can be admitted, therefore, that efficient filtration of low-frequency noise can be reliably attained by changing characteristics of "short" pulses through narrowing the bandwidth of the band-pass filters $25_1 \ldots 25_n$.

Pulses at the inputs $8_1, 8_2 \ldots 8_n$ of the circuits $7_1, 7_2 \ldots 7_n$ of analog memory are exponential in shape.

In order to achieve maximum sensitivity with minimum errors in the proposed pulse characteristic meter, the control pulse should be "locked on" to the maximum of the exponential widened pulse and remain so locked no matter how the duration of input pulses vary. This is done in the synchronizing unit 9.

Widened exponential pulses are supplied to the input 10 of the synchronizing unit 9. The amplifier 61 of the unit 9 secures a specified sensitivity of synchronization. The amplified exponential signal is delivered to the differentiating circuit 63, 64 whose output is an overshot pulse. The trailing edge of this pulse which is amplified and gated by the amplifier 65 starts the synchronizing signal generating circuit 67. "Short" (several nanoseconds) control pulses are transmitted from the output 8 of the circuit 67 to the inputs $11_1, \ldots 11_n$ of the analog memory circuits $7_1, 7_2, \ldots 7_n$ to perform linear conversion of widened pulses into constant voltage $U_4$. The synchronizing unit 9 supplies signals for starting and repeated starting of the analog-digital converter 15, availability of the converter 15 and some other pulses required for regular operation of this converter 15, the microprocessor computer 17 and the display unit 20.

The pulse characteristic meter designed as described above is intended to be used in pulse process research in laser engineering, nuclear physics (thermonuclear fusion exploration), pulse generation techniques, and some other fields.

The proposed design of a pulse characteristic meter is meant to provide an array of devices capable of conversion into code and measuring of amplitude-time response, energy and shape features (shape coefficients) of low-level (from 2 mV to 100 mV) pico- and nanosecond pulses over a wide range of shape and rate variations, including metering of single pulses.

The proposed pulse characteristic meter can provide a rather detailed inventory of complex-shaped pulse parameters by encoding and metering the generalized amplitude, duration, area, charge and energy of pulses, as well as coefficients describing the shape of pulses, the length of edges (if a differentiating circuit is available at the input of the meter), and other calculations on the basis of the measured generalized pulse amplitude.

The proposed pulse characteristic meter makes for a three- or fourfold increase of the accuracy of measurements and, in addition, a tenfold expansion of the amplitude and duration ranges. The functional capabilities of the meter are also improved and broadened due to the following:

adding area, charge and energy to characteristics that can be measured along with the generalized amplitude and duration of the pulse;

adding coefficients describing the pulse shape to the spectrum of measured characteristics;

widening pulse amplitude and duration ranges the meter is capable of operating in;

finding pulse amplitudes through the measured generalized amplitude and available shape coefficient;

operating as a part of computerized measuring systems;

The proposed pulse characteristic meter provides, therefore, higher accuracy of measurement of amplitude-time and charge characteristics of pulses and a much wider area of application.

What is claimed is:

1. A pulse characteristic meter capable of measuring and converting (into digital code) of time-amplitude and energy characteristics, and shape coefficients of low-level (2 to 5 mV) pulses in the pico-, nano- and microsecond ranges over a wide spectrum of varying amplitudes, lengths, shapes and rates, including single pulses, comprising:

n integrated pulse converters having nonlinear amplitude response and one integrated pulse converter having linear amplitude response, both said converters performing such conversion of input pulses as to make the amplitude of widened pulses the linear function of their length and, respectively, the linear and nonlinear function of the amplitude of input pulses; inputs, first, second and third outputs of said converters;

a system of processing of said converted pulses;
said inputs of said integrated converters, which are joined and form the input of said pulse characteristic meter;
said outputs of said converters, connected to said converted pulse processing system;
said converted pulse processing system comprising:
a pulse subtraction circuit constituting a complex converter having amplitude characteristic described by a quadratic function;
a first and second inputs, an output of said pulse subtraction circuit;
said first and second inputs of said pulse subtraction circuit, connected to said first outputs of two first integrated converters of said n integrated pulse converters;
n analog memory circuits intended to perform linear conversion of a pulsed signal into a contant voltage during the short control pulse and to store the converted signal for some time; a first input, a second input, an output of each said n analog memory circuits;
said first input of the first analog memory circuit of said n analog memory circuits, electrically connected to said output of said subtraction circuit;
said first inputs of n-1 analog memory circuits from said n analog memory circuits, electrically connected to said first outputs of n-2 integrated pulse converters from said n integrated pulse converters and to said first output of said integrated pulse converter having linear amplitude response;
an analog-digital converter intended to convert the analog information into the binary code; inputs; and input-output, an output of said analog-digital converter;
a synchronizing unit intended to generate short control pulses to operate said analog memory circuits, starting pulses and repeated starting pulses of said analog-digital converter, termination pulses of said analog-digital converter; a first input, a second input, outputs of said synchronizing unit;
a first said input of said synchronizing unit, connected to said second output of said integrated pulse converter having linear amplitude response;
said first output
the first of said outputs of said synchronizing unit, connected to said second joined inputs of said n analog memory circuits;
a channel switch intended to connect said outputs of said analog memory circuits alternately to said first input of said analog-digital converter for a period required to process the signals fed from said outputs of said analog memory circuits in said analog-digital converter; n inputs, a separate input, an output of said channel switch;
said outputs of said n analog memory circuits, connected to said n inputs of said channel switch;
said output of said channel switch, connected to said input of said analog-digital converter;
a common channel;
data buses;
a display unit;
a microprocessor computer intended to perform logical and mathematical operations, data conversion into the binary-decimal code, and delivery of information to said common channel; a first output, a second output, a third output; a first input, a second input, a third input, an input-output of said microprocessor computer;
said first and second outputs of said microprocessor computer, connected via said data buses to said dislay unit;
said third output of said microprocessor computer, connected by one of said data buses to said common channel;
said input-output of said microprocessor computer, connected by one of said data buses to said output-input of said analog-digital converter;
said second input of said analog-digital converter, connected by one data bus of said data buses to said second output of said synchronizing unit;
said second input of said microprocessor computer, connected by one data bus of said data buses to said third outputs of said integrated pulse converters; logical "0" or logical "1" signals are fed through said data bus to indicate dimensions of measurands depending on the amplitude band and duration of pulses.

2. A pulse characteristic meter as claimed in claim 1, comprising n band-pass filters inserted into the electrical connection between said integrated pulse converters and said analog memory circuits, and intended to reduce the low-frequency noise due to the rise of the amplitude-frequency response of said integrated pulse converters in the low-frequency range; a first input, a second input, and an output of each said band-pass filter;
said first input of the first band-pass filter from said n band-pass filters, connected to said output of said subtraction circuit;
said second input of the first band-pass filter from said n band-pass filters, connected to said joined outputs of the first and second integrated pulse converters from said n integrated pulse converters;
first said outputs of n-2 said integrated pulse converters having nonlinear amplitude response and the first said output of said integrated pulse converter having linear amplitude response being connected to said first inputs of n-1 band-pass filters from said n band-pass filters;
said outputs of said n band-pass filters, connected to said first inputs of said n analog memory circuits.

3. A pulse characteristic meter as claimed in claim 1, comprising:
a pulse shape class information input unit intended to feed and convert data on the pulse shape class; an input, an output of said pulse shape class information input unit;
said input of said pulse shape class information input unit, which is the pulse shape information input of the pulse characteristic meter;
an input information converting unit intended to convert information into the binary code and transmit information to the input of the microprocessor computer;
an input, a first output, a second output of said input information converting unit;
said input of said input information converting unit, connected to said output of said pulse shape class information input unit;
said first output of said input information converting unit, connected to said third input of said microprocessor computer;
said second output of said input information converting unit, connected to said separate input of said channel switch.

4. A pulse characteristic meter as claimed in claim 2, comprising:

a pulse shape class information input unit intended to feed and convert the information on the pulse shape class; an input and an output of said pulse shape class information input unit;

said input of said pulse shape class information input unit, which is the pulse shape information input of the pulse characteristic meter;

an input information converting unit intended to convert the information into the binary code and transmit information to the input of the microprocessor computer; an input, a first output and second output of said input information converting unit;

said input of said input information converting unit, connected by one of said data buses to said output of said pulse shape class information input unit;

said first output of said input information converting unit, connected to said third input of said microprocessor computer;

said second output of said input information converting unit, connected to said separate input of said channel switch.

5. A pulse characteristic meter as claimed in claim 1, wherein said synchronizing unit is equipped with an external synchronizing input in order to widen the functional capabilities of the pulse characteristic meter.

6. A pulse characteristic meter as claimed in claim 2, wherein said synchronizing unit is equipped with an external synchronizing input in order to widen the functional capabilities of the pulse characteristic meter.

7. A pulse characteristic meter as claimed in claim 3, wherein said synchronizing unit is equipped with an external synchronizing input in order to widen the functional capabilities of the pulse characteristic meter.

* * * * *